(12) United States Patent
Lee et al.

(10) Patent No.: US 8,426,885 B2
(45) Date of Patent: Apr. 23, 2013

(54) LIGHT EMITTING DEVICE

(75) Inventors: SangYoul Lee, Seoul (KR); HwanHee Jeong, Seoul (KR); KwangKi Choi, Seoul (KR); JuneO Song, Seoul (KR); ChungSong Kim, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 0 days.

(21) Appl. No.: 13/283,082

(22) Filed: Oct. 27, 2011

(65) Prior Publication Data

US 2012/0043574 A1 Feb. 23, 2012

(30) Foreign Application Priority Data

Oct. 29, 2010 (KR) .................. 10-2010-0107136

(51) Int. Cl.
*H01L 23/00* (2006.01)

(52) U.S. Cl.
USPC ............................................. 257/98; 257/99

(58) Field of Classification Search .............. 257/98, 257/99
See application file for complete search history.

(56) References Cited

U.S. PATENT DOCUMENTS

| | | | |
|---|---|---|---|
| 8,179,039 B2 * | 5/2012 | Jeong et al. ............ | 313/506 |
| 2006/0261364 A1 * | 11/2006 | Suehiro et al. ............ | 257/100 |
| 2009/0154513 A1 * | 6/2009 | Shin ....................... | 372/36 |
| 2011/0101399 A1 * | 5/2011 | Suehiro et al. ............ | 257/98 |
| 2011/0193113 A1 * | 8/2011 | Jeong et al. ............ | 257/91 |
| 2011/0198991 A1 * | 8/2011 | Jeong et al. ............ | 313/506 |
| 2011/0233575 A1 * | 9/2011 | Huang et al. ............ | 257/89 |

* cited by examiner

*Primary Examiner* — Douglas Menz
(74) *Attorney, Agent, or Firm* — Lowe Hauptman Ham & Berner, LLP

(57) ABSTRACT

Disclosed is a light emitting device according to the present embodiment, which includes, a substrate; a first electrode layer disposed on the substrate; a light emitting structure disposed on the first electrode layer, which includes a first conductive semiconductor layer, a second conductive semiconductor layer and an active layer placed between the first and second conductive semiconductor layers; and a conductive layer, which includes a base conductive layer disposed under the substrate, a body connected to the base conductive layer while passing through the substrate and the first electrode layer, and a head disposed on top of the first electrode layer. Accordingly, the light emitting device is capable of improving light extraction efficiency and include a conductive layer to provide a carrier as well as a semiconductor layer, which are securely formed on the device.

20 Claims, 19 Drawing Sheets

LIGHT EMITTING DEVICE

CROSS-REFERENCE TO RELATED APPLICATION

This application claims the priority benefit of Korean Patent Application No. 10-2010-0107136, filed on Oct. 29, 2010 in the Korean Intellectual Property Office, the disclosure of which is incorporated herein by reference.

BACKGROUND

1. Field

Embodiments of the present disclosure relate to a light emitting device.

2. Description of the Related Art

In general, a light emitting device has various structures to improve photoemission effects that extract light emitted by an active layer to the outside. A method for formation of a light extraction structure on a light emission route, a method for uniform diffusion of a carrier over an active layer, or the like have been proposed. However, light emitted by the active layer outputs not only through an opening of a light emitting device but also irradiates from all directions of the active layer. Alternatively, it is difficult to effectively extract light directing a substrate of the light emitting device by improving a light extraction structure or carrier diffusion described above. Therefore, there is a need for approaches to extract light capable of emitting toward lateral sides of an active layer or in a direction of a substrate.

SUMMARY

Accordingly, embodiments provide a light emitting device capable of improving light extraction efficiency and including a conductive layer to provide a carrier as well as a semiconductor layer, which are securely formed on the device.

According to one embodiment, there is disposed a light emitting device, including: a base conductive layer located on a substrate; a transparent substrate disposed on the base conductive layer; a first electrode layer placed on the transparent substrate; a light emitting structure placed on the first electrode layer and including an active layer, on which a first conductive semiconductor layer is disposed on one face while a second conductive semiconductor layer adjacent to the first electrode layer is disposed on the other face of the active layer; and a coupling pin disposed to penetrate through the light emitting structure to the base conductive layer and to electrically connect the first electrode layer and the base conductive layer.

BRIEF DESCRIPTION OF THE DRAWINGS

Details of the embodiments will be more clearly understood from the following detailed description taken in conjunction with the accompanying drawings, in which.

DETAILED DESCRIPTION OF THE PREFERRED EMBODIMENTS

Figure 1A:
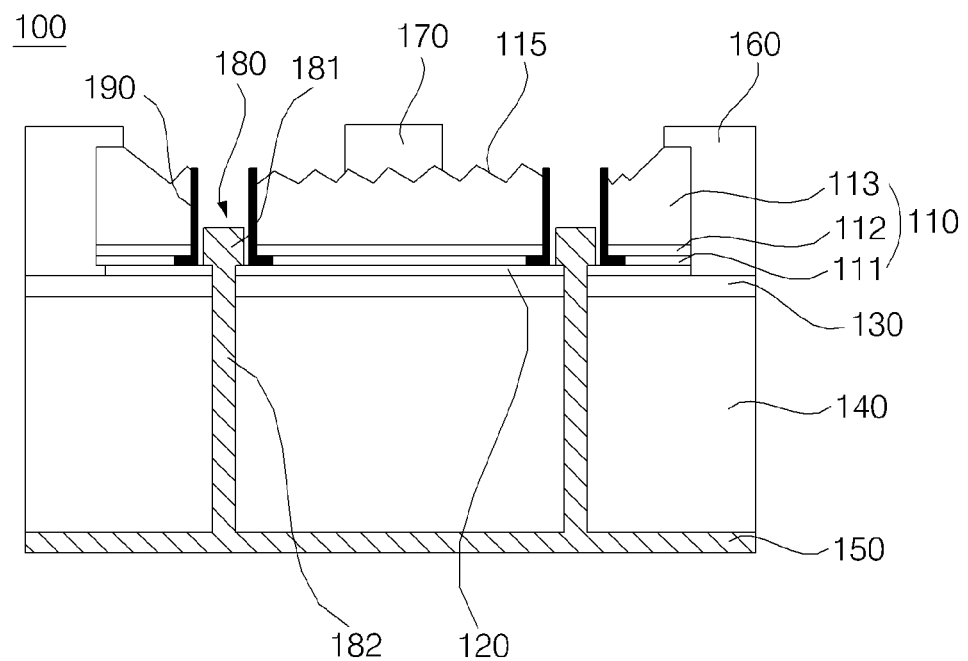
FIG. 1A is a cross-sectional view illustrating a light emitting device according to one embodiment.

In description of embodiments, in the case where each layer (film), region, pattern or structure is disposed "on" or "under" each substrate, layer (film), region, pad or pattern, such terms as "on" and "under" may be used to indicate that the former is "directly" or "indirectly" placed on another later which may be interposed therebetween. Also, a basis of such top or bottom of the layer will be explained with reference to the drawings.

In the drawings, thicknesses and/or sizes of respective layers may be enlarged, omitted or schematically illustrated for convenience in description and/or clarity. In addition, the size or area of each constituent element may not entirely reflect the actual size thereof.

Hereinafter, the present disclosure will be described in more detail with reference to the annexed drawings.

Figure 1B:
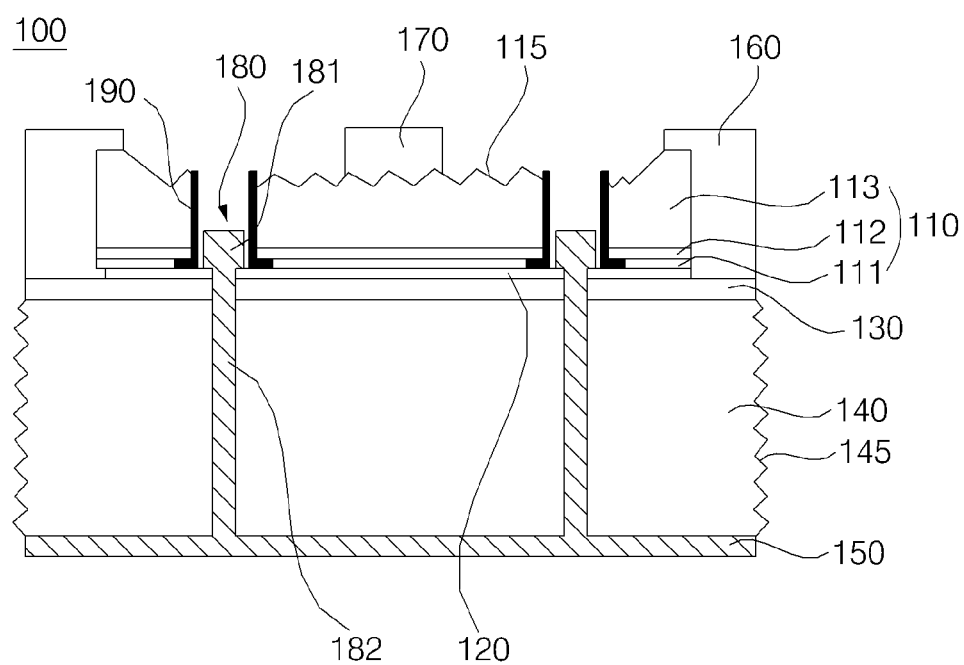
FIG. 1B is a cross-sectional view illustrating a light emitting device according to one embodiment.
Figure 1C:
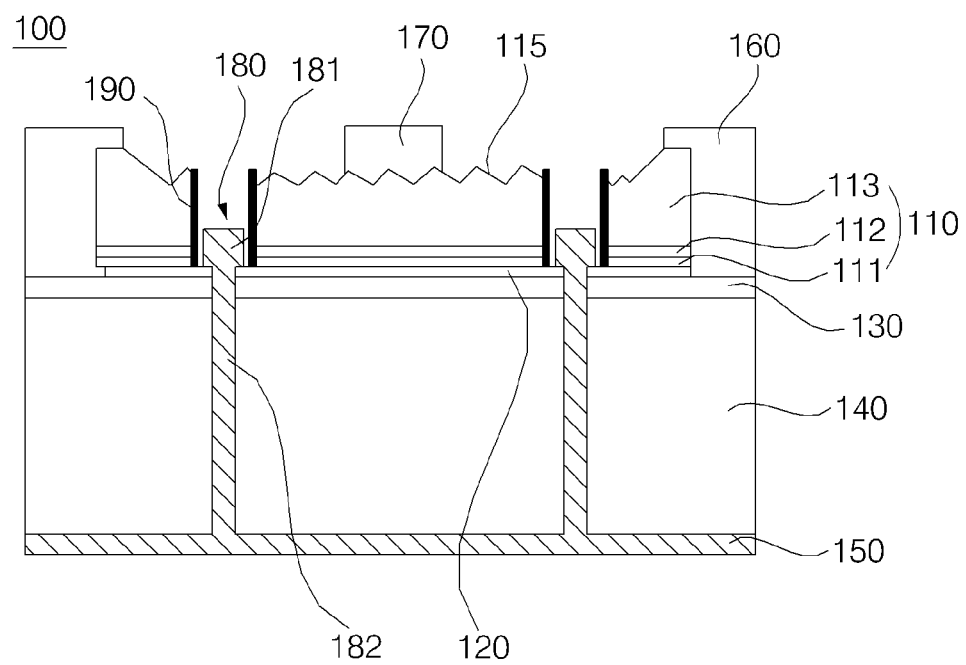
FIG. 1C is a cross-sectional view illustrating a light emitting device according to one embodiment.

FIGS. 1A to 1C are cross-sectional views illustrating a light emitting device according to one embodiment.

Referring to FIGS. 1A to 1C, a light emitting device 100 may include; a substrate 140, a first electrode layer 120 placed on the substrate 140, a light emitting structure 110 placed on the first electrode layer 120, that includes a first conductive semiconductor layer 111, a second conductive semiconductor layer 113 and an active layer 112 disposed between the first conductive semiconductor layer 111 and the second conductive semiconductor layer 113, and a conductive layer 180 having a body 182 that passes through the first electrode layer 120 as well as a head 181 formed on top of the first electrode layer 120.

The substrate 140 may be formed using a transmissive material, for example, any one selected from sapphire ($Al_2O_3$), GaN, ZnO or AlO, without being particularly limited thereto. Or, compared to the sapphire ($Al_2O_3$) support material, a SiC support material having high thermal conductivity may be used.

The substrate 140 may further have a patterned substrate structure (PSS) disposed on the top face, in order to improve light extraction efficiency. The support material 140 described in the present description may have such a PSS structure or not.

The substrate 140 may be formed using a material having excellent thermal conductivity or a conductive material, specifically, using a metal material or a conductive ceramic. The substrate 140 may be formed in a single layer, double structure or multilayer structure.

That is, the substrate 140 may be prepared using metals, for example, at least one selected from Au, Ni, W, Mo, Cu, Al, Ta, Ag, Pt and Cr or alloys comprising a combination of two or more thereof and, in addition, by laminating two or more different materials. The substrate 140 may also be realized using a carrier wafer such as Si, Ge, GaAs, ZnO, SiC, SiGe, GaN, $Ga_2O_3$, etc.

If the substrate 140 has light transmittable properties, the substrate 140 may scatter light emitted by the active layer 112 in a lateral direction when light passes through the substrate 140.

If the substrate 140 has an excessively large thickness, light absorption is increased. On the contrary, if the thickness of the substrate 140 is too small, light distribution is reduced and reliability may be decreased. Therefore, the substrate 140 may be formed to a thickness of 50 μm to 500 μm. In addition, the substrate 140 may include a material having a refractive index lower than that of the second conductive semiconductor layer 113 but higher than that of silicon epoxy, in order to shift light from the second conductive semiconductor layer 113 to the base conductive layer 150. For instance, the substrate 140 may have a refractive index ranging from 1.4 to 2.4.

As illustrated in FIG. 1B, the substrate 140 may have a first light extraction structure 145 on at least one region thereof and, for example, the first light extraction structure 145 may comprise unevenness having predetermined roughness. The first light extraction structure 145, as shown in FIG. 1B, may be formed on a lateral side area of the substrate 140, without being particularly limited thereto. Since the substrate 140 has such a first light extraction structure 145, it is possible to prevent light passing through an interface between the substrate 140 and the outside from being totally reflected at the interface (between the substrate 140 and the outside), in turn being dissipated. Accordingly, light extraction efficiency of the light emitting device 100 may be improved.

The base conductive layer 150 may be disposed under the substrate 140. The base conductive layer 150 may be electrically connected to the first electrode layer 120 to supply power to the first electrode layer 120. Meanwhile, in order to prevent light emitted by the active layer 112 from being absorbed by the base conductive layer 150, the base conductive layer 150 may have light reflective properties. For instance, the base conductive layer 150 may be formed using a material having excellent light reflection. Such materials may include, for example, Ag, Rh, Ni, Au, Pd, Ir, Ti, Pt, W, Al, etc., or alloys thereof may be used for the foregoing.

Meanwhile, the first electrode layer 120 may be disposed on the substrate 140 and comprise at least one layer selected from an ohmic layer (not shown), a reflective layer (not shown) or a bonding layer (not shown). For instance, the first electrode layer 120 may have a structure of ohmic layer/reflective layer/bonding layer, a laminate structure of an ohmic layer/reflective layer or a structure of a reflective layer (including ohmic)/bonding layer, without being particularly limited thereto. For instance, the first electrode layer 120 may be a laminate comprising a reflective layer and an ohmic layer sequentially stacked.

The reflective layer (not shown) may be disposed between the ohmic layer (not shown), and formed using a material with excellent reflective properties, for example, selected from a group consisting of Ag, Ni, Al, Rh, Pd, Ir, Ru, Mg, Zn, Pt, Au, Hf, and combinations thereof. Alternatively, using the foregoing metal material together with a light transmittable material such as IZO, IZTO, IAZO, IGZO, IGTO, AZO, ATO, etc., the reflective layer may be formed in a single or multi-layered structure. Further, in the case where the reflective layer (not shown) may be formed using a material which comes into ohmic contact with the light emitting structure 110 (i.e., a first semiconductor layer 111), the ohmic layer (not shown) should not be further disposed, without being particularly limited thereto.

The ohmic layer (not shown) may be in ohmic contact with the bottom of the light emitting structure 110 and formed in a layer or multiple patterns. The ohmic layer may selectively comprise a transmissive electrode layer and metal and, for example, may be realized in a single layer or multi-layered structure, using at least one selected from indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), $IrO_x$, $RuO_x$, $RuO_x$/ITO, Ni, Ag, Ni/$IrO_x$/Au and Ni/$IrO_x$/Au/ITO. The ohmic layer (not shown) may enable smooth injection of a carrier into the first conductive semiconductor layer 111, however, is not necessarily formed.

The first electrode layer 120 may have a bonding layer (not shown) and, in this case, the bonding layer (not shown) may contain a barrier metal or bonding metal, for example, at least one selected from Ti, Au, Sn, Ni, Cr, Ga, In, Bi, Cu, Ag or Ta, without being particularly limited thereto.

Between the first electrode layer 120 and the substrate 140, a bonding layer 130 may be disposed to combine the substrate 140 and the first electrode layer 120. The bonding layer 130 may enable bonding between the substrate 140 and the first electrode layer 120 and be formed using a transmissive material, without being particularly limited thereto.

The light emitting structure 110 may be placed on the first electrode layer 120. The light emitting structure 110 may include at least the first conductive semiconductor layer 111, the active layer 112 and the second conductive semiconductor layer 113, in particular, have a configuration of the active layer 112 interposed between the first conductive semiconductor layer 111 and the second conductive semiconductor layer 113.

The first conductive semiconductor layer 111 may be realized as a p-type semiconductor layer to supply electrons to the active layer 112. The first conductive semiconductor layer 111 may comprise any one selected from semiconductor materials represented by the formula of $In_xAl_yGa_{1-x-y}N$ ($0 \leq x \leq 1$, $0 \leq y \leq 1$, $0 \leq x+y \leq 1$), for example, a group consisting of GaN, AlN, AlGaN, InGaN, InN, InAlGaN, AlInN, etc., and may be doped with p-type dopants such as Mg, Zn, Ca, Sr, Ba, etc.

The active layer 112 may be disposed on the first conductive semiconductor layer 111. The active layer 112 may be formed with a single or multi-quantum well structure, a quantum-wire structure, a quantum dot structure, or the like, using compound semiconductor materials based on Group III-V elements.

In the case where the active layer 112 has a quantum well structure, for example, it may have a single or multi-quantum well structure including a well layer having the formula of $In_xAl_yGa_{1-x-y}N$ ($0 \leq x \leq 1$, $0 \leq y \leq 1$, $0 \leq x+y \leq 1$) and a barrier layer having a formula of $In_aAl_bGa_{1-a-b}N$ ($0 \leq a \leq 1$, $0 \leq b \leq 1$, $0 \leq a+b \leq 1$). The well layer may be formed of a material having a smaller band gap than the barrier layer.

Above and/or below the active layer 112, a conductive clad layer (not shown) may be disposed. The conductive clad layer (not shown) may be formed of AlGaN-based semiconductor and have a larger band gap than that of the active layer 112.

Meanwhile, an insertion layer (not shown) may be formed between the active layer 112 and the first conductive semiconductor layer 111. The insertion layer may be an electron blocking layer to prevent a phenomenon wherein electrons injected from the second conductive semiconductor layer 113 to the active layer 112 by applying a high current are not recombined with the active layer 112 but, instead, flow toward the conductive semiconductor layer 111. The insertion layer (not shown) may have a larger band gap than that of the barrier layer contained in the active layer 112 and formed of a semiconductor layer containing Al such as p-type AlGaN, without being particularly limited thereto. Since the insertion layer (not shown) has a relatively larger band gap than the active layer 112, the phenomenon described above wherein electrons injected from the second conductive semiconductor layer 113 are not recombined with the active layer 112 but, instead, flow toward the conductive semiconductor layer 111, may be successfully prevented. Accordingly, the probability of recombination of electrons and holes in the active layer 112 may be increased while preventing current leakage.

The second conductive semiconductor layer 113 may be placed on the active layer 112. The second semiconductor layer 113 may be realized as an n-type semiconductor and supply electrons to the active layer 112. The second conductive semiconductor layer 113 may comprise any one selected from semiconductor materials represented by the formula of $In_xAl_yGa_{1-x-y}N$ ($0 \leq x \leq 1$, $0 \leq y \leq 1$, $0 \leq x+y \leq 1$), for example, a group consisting of GaN, AlN, AlGaN, InGaN, InN, InAlGaN, AlInN, etc., and may be doped with n-type dopants such as Si, Ge, Sn, etc.

The first conductive semiconductor layer 111, active layer 112, inserting layer (not shown) and second conductive semiconductor layer 113, as described above, may be fabricated by conventional methods, for example; metal organic chemical vapor deposition (MOCVD), chemical vapor deposition (CVD), plasma-enhanced chemical vapor deposition (PECVD), molecular beam epitaxy (MBE), hydride vapor phase epitaxy (HVPE), and so forth, however, the method is not particularly limited thereto.

A doping concentration of the conductive dopant in the first conductive semiconductor layer 111 and the second conductive semiconductor layer 113 may be uniform or non-uniform. That is, a plurality of semiconductor layers may be fabricated to have various distributions of doping concentrations, without being particularly limited thereto.

The first conductive semiconductor layer 111 may be realized as an n-type semiconductor layer while the second conductive semiconductor layer 113 may be realized as a p-type semiconductor layer. Also, a third conductive semiconductor layer (not shown) having an n-type or p-type semiconductor layer may be placed on the second conductive semiconductor layer 113. Accordingly, the light emitting device 100 may have at least one selected from N-P junction, P-N junction, N-P-N junction and P-N-P junction structures.

The light emitting structure 110 may include a second light extraction structure 115 and a second electrode layer 170 disposed thereon.

The second light extraction structure 115 may be placed on the top of the second conductive semiconductor layer 113, without being particularly limited thereto.

The second light extraction structure 115 may be positioned on a part or the entirety of the top face of the second conductive semiconductor layer 113. The second light extraction structure 115 may be formed by etching at least one region of the top face of the second conductive semiconductor layer 113, without being particularly limited thereto. Such etching may include wet and/or dry etching and, after etching, the top face of the second conductive semiconductor layer 113 may have unevenness by which the second light extraction structure 115 is formed.

Such unevenness may be formed with a regular shape and arrangement or irregular shape and arrangement, without being particularly limited thereto. The unevenness is substantially a non-planar top face and may have at least one selected from a texture pattern, a dent pattern and an uneven pattern, without being particularly limited thereto.

The unevenness may be formed to have a lateral cross-section in a variety of shapes, such as a circular column, polygonal column, circular cone, polygonal pyramid, circular truncated cone or polygonal truncated pyramid, or the like, and may have a lateral cross-section in a cone shape.

Meanwhile, the second light extraction structure 115 may be fabricated by a conventional method such as a photo-electro chemical (PEC) process, without being particularly limited thereto. Since the second light extraction structure 115 is formed on the top face of the second conductive semiconductor layer 113, it is possible to prevent light emitted by the active layer 112 from being totally reflected from the top face of the second conductive semiconductor layer 113, which in turn inhibits re-absorption or scattering of the light, thereby contributing to improvement in light extraction efficiency of the light emitting device 100.

The second electrode layer 170 may include an electrode having at least one pad and/or a predetermined pattern. The second electrode layer 170 may be disposed in a center part, an outer region or edge region of the top face of the second conductive semiconductor layer 113, without being particularly limited thereto. Otherwise, the second electrode layer 170 may be disposed on other regions instead of the top face of the second conductive semiconductor layer 113, without being particularly limited thereto.

The second electrode layer 170 may be formed in a single layer or multi-layered structure using metals, for example, selected from In, Co, Si, Ge, Au, Pd, Pt, Ru, Re, Mg, Zn, Hf, Ta, Rh, Ir, W, Ti, Ag, Cr, Mo, Nb, Al, Ni, Cu and WTi, or alloys thereof.

A conductive layer 180 may electrically connect the second conductive semiconductor layer 113 and the base conductive layer 150 and secure a region from the light emitting structure 110 to the base conductive layer 150.

At least one or two or more of the conductive layers 180 is (are) disposed on the light emitting structure 110, to secure the light emitting structure 110, the first electrode layer 120, the substrate 140 and the base conductive layer 150, thus enhancing electrical contact properties.

The conductive layer 180 may be disposed in plural so long as it does not considerably deteriorate luminous efficacy. In the case where plural conductive layers 180 are disposed on the light emitting structure 110, these conductive layers 180 are disposed at a constant interval thereon, thereby achieving uniform electrical contact properties between overall structures including the light emitting structure 110 and the base conductive layer 150.

Meanwhile, the conductive layer 180 may include a head 181 positioned above the first electrode layer 130 and a body 182 connecting the head 181 to the base conductive layer 150. The head 181 may have a circular, elliptical, triangular or polygonal shape and a width of the head 181 may be broader than a width of the body 182. For instance, if the width of the head 181 is excessively large, a light emitting region may be reduced, in turn deteriorating luminous efficacy. On the contrary, if the width of the head 181 is too small, adhesion increasing effects and/or electrical contact effects may be deteriorated. Therefore, the width of the head 181 may range from 50 to 100 μm. Alternatively, if a width of the body 182 is excessively large, supporting effects may not be attained by the head 181. On the other hand, if the body 182 has too small a width, the body is difficult to form. Therefore, the width of the body 182 may range from 10 to 30 μm. Moreover, a height of the head 181 may range from 1 to 6 μm.

Since the head 181 of the conductive layer 180 is present in the light emitting structure 110, the head 181 needs to be insulated from the light emitting structure 110. For this purpose, by forming a passivation layer 190, electrical short (or short circuit) between the light emitting structure 110 and the head 181 may be prevented. The head 181 may electrically connect the second conductive semiconductor layer 113 and the base conductive layer 150. Therefore, the head 181 may be formed using a conductive material. For instance, the head 181 may be composed of Au, Ni, Pt, Al, Cr, Ag or alloys thereof. Also, the body 182 may be composed of the same material as used for the head 181.

For instance, by puncturing the light emitting structure 110 to reach the base conductive layer 150, a through-hole is formed and subjected to vapor deposition using the material described above, i.e., Au, Ni, Pt, Al, Cr, Ag or alloys thereof or plating the same, thus preparing the conductive layer 180. For example, the conductive layer 180 may be formed by vapor-depositing the foregoing material through through-hole sputtering deposition to electrically connect the second conductive semiconductor layer 110 and the base conductive layer 150. Otherwise, by plating the through-hole having the passivation layer 190 formed therein with the material described above, i.e., Au, Ni, Pt, Al, Cr, AG or alloys thereof, the conductive layer 180 may be fabricated.

FIGS. 1A and 1B illustrate the passivation layer 190 formed in an L-shape, wherein right and left projections are formed around the through-hole and disposed opposite each other. Alternatively, the foregoing may be disposed in any other form, without being particularly limited thereto. For instance, the passivation layer 190 may be formed in an I shape, as shown in FIG. 1C, or have a desired projection or be bent, without being particularly limited thereto. A shape of the passivation layer 190 formed inside the through-hole will be described below.

FIGS. 2 to 6 are referential views illustrating the passivation layer 190 in various types shown in FIGS. 1A to 1C.

Figure 2:
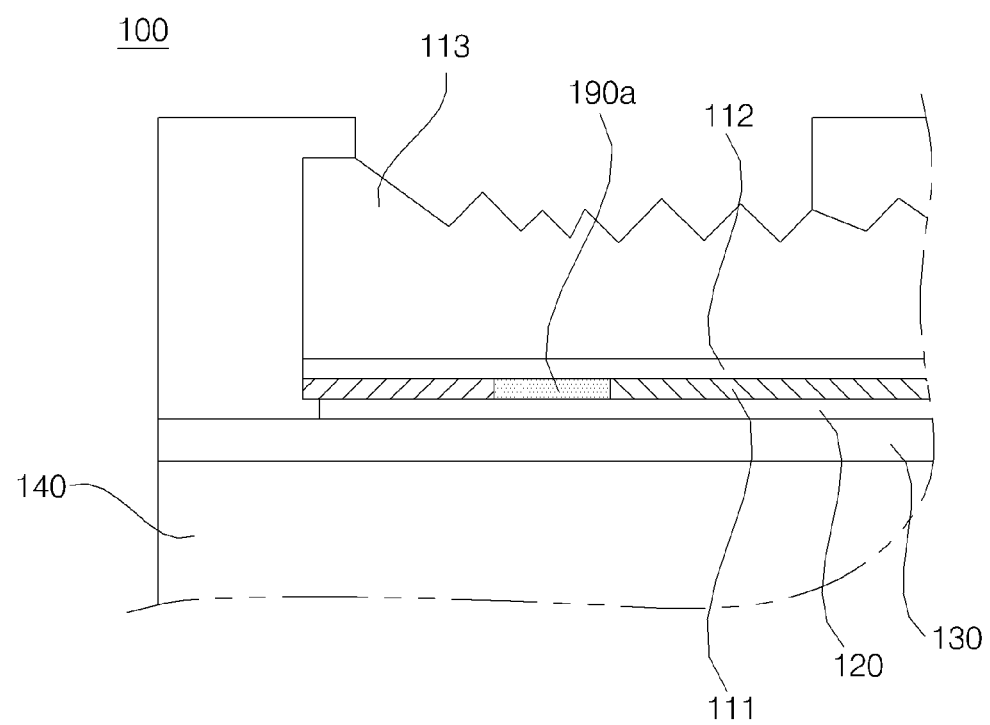
FIGS. 2 to 6 are referential views illustrating types of passivation layers according to one embodiment.

FIG. 2 is a cross-sectional view illustrating the configuration of a light emitting device according to one embodiment, before forming a through-hole 180a.

Referring to FIG. 2, a first passivation layer 190a may be formed on at least one region of a layer on which the second conductive semiconductor layer 113 is formed. The first passivation layer 190a may be prepared by partially etching at least one region of the second conductive semiconductor layer 113 and then embedding a passivation material in the etched region, after forming the second semiconductor layer on the first electrode layer 120. Otherwise, after placing the passivation material on a part of the first electrode layer 120, the second conductive semiconductor layer 113 is disposed on the other part of the first electrode layer 120, to form the first passivation layer, without being particularly limited.

Figure 3:
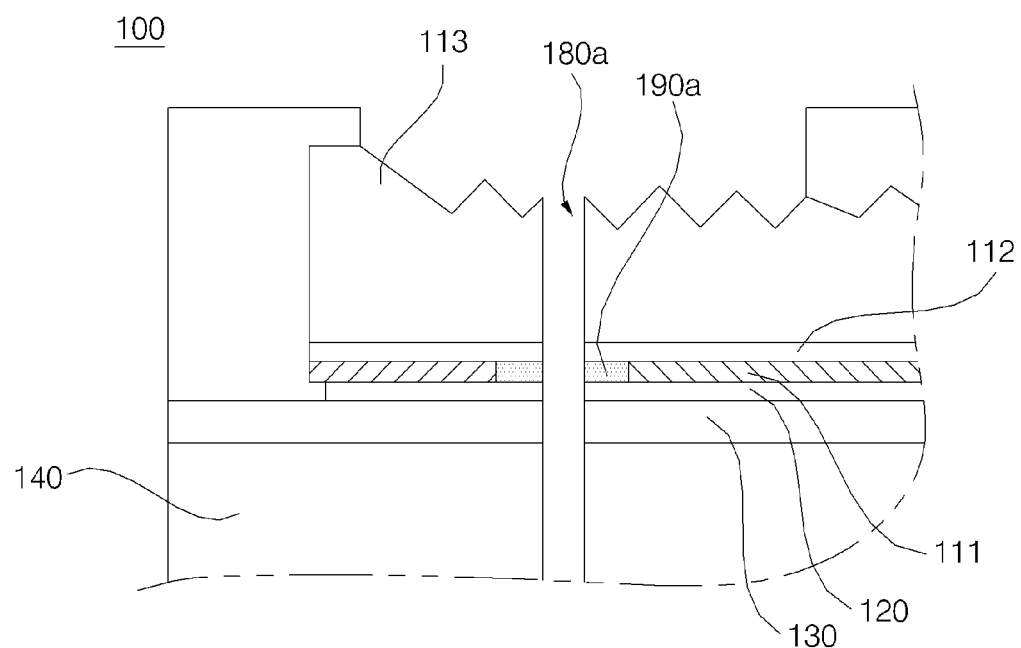

FIG. 3 is a cross-sectional view illustrating the configuration of the light emitting device according to one embodiment, after forming the through-hole 180a and before etching.

Referring to FIG. 3, for example, laser irradiating from a direction of the first conductive semiconductor layer 111 toward the transparent substrate layer 140 may form a through-hole 180a. Through the through-hole 180a, the first conductive semiconductor layer 111, the active layer 112, the first passivation layer 190a, the first electrode layer 120 and the transparent substrate layer 140 may be exposed in a lateral direction. On the other hand, since the through-hole 180a is formed by puncturing a region, on which the first passivation layer 190a is present, exposure of the second conductive semiconductor layer 113 in the lateral direction may be prevented.

Figure 4:
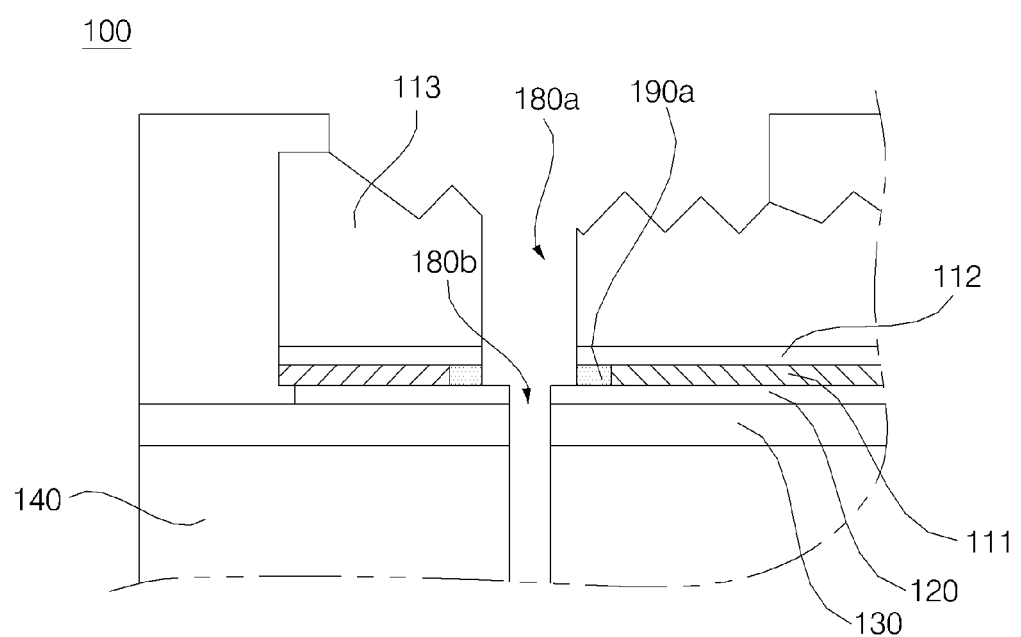

FIG. 4 is a cross-sectional view illustrating the configuration of the light emitting device according to one embodiment, after the etching process.

Referring FIG. 4, the first conductive semiconductor layer 111 and the active layer 112 are partially etched to further enlarge the through-hole 180a and expose one region of the first conductive layer 120 in an upper direction, in turn forming a head region 180b.

Figure 5A:
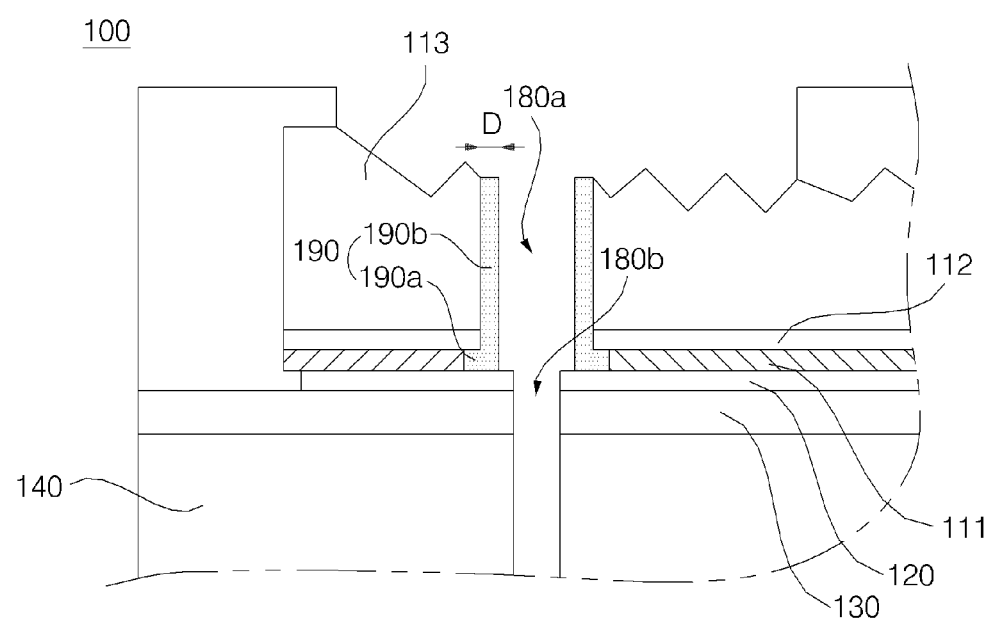
Figure 5B:
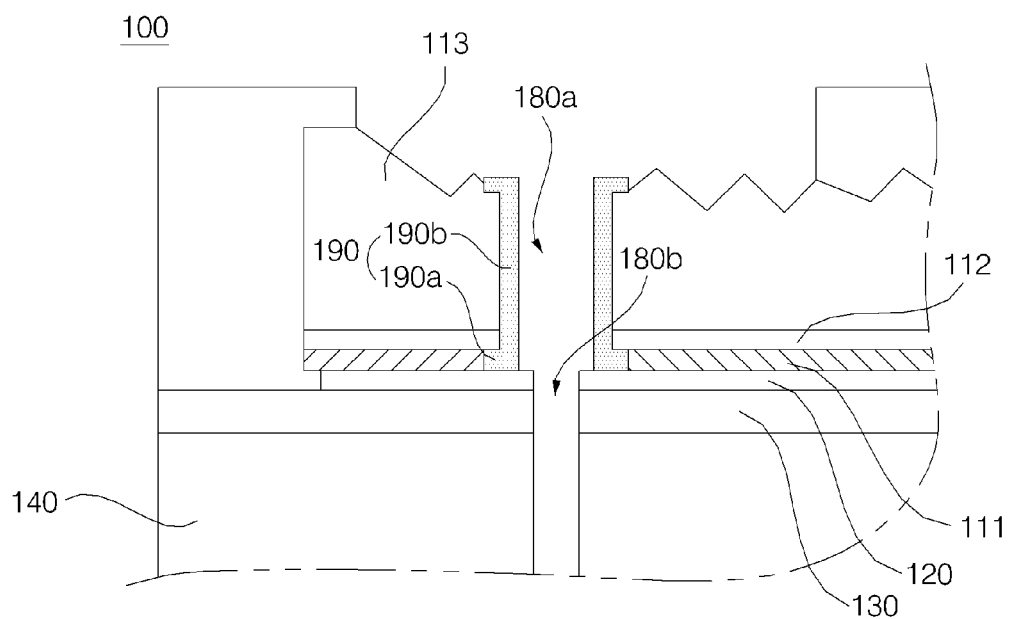

FIGS. 5A and 5B are views illustrating the configuration of the light emitting device according to one embodiment, after forming a second passivation layer 190b.

Referring to FIGS. 5A and 5B, the second passivation layer 190b may be formed to cover the first conductive layer 111 prepared by forming the through-hole 180a and etching the same, the active layer 112 and an exposed region in a lateral direction. The second passivation layer 190b may be continuously formed following the first passivation layer 190a, resulting in a passivation layer 190. A width 'D' of the second passivation layer 190b may be smaller than an exposed region of the first electrode layer 120, in order to form a head region 180b. Meanwhile, as shown in FIG. 5B, the top of the second passivation layer 190b may cover one region of the first conductive semiconductor layer 111, without being particularly limited thereto.

After forming the second passivation layer 190, the head region 180b and the through-hole 180a may be subjected to sputtering deposition using Au, Ni, Pt, Al, Cr, Ag or alloys thereof or plating, thus being embedded. By embedding the through-hole 180a and the head region 180b, the conductive layer 180 may be formed. The formed conductive layer 180 may reliably enable electrical connection of the second conductive semiconductor layer 113 to the base conductive layer 150 while preventing short circuit between the active layer 112 and the second conductive semiconductor layer 113. The body of the conductive layer 180 is disposed in the through-hole 180a while the head of the conductive layer 180 may be placed in the head region 180b. Therefore, the light emitting structure 110 is securely supported by the head 181, thereby attaining structural stability of the light emitting device 100 according to one embodiment.

Figure 6:
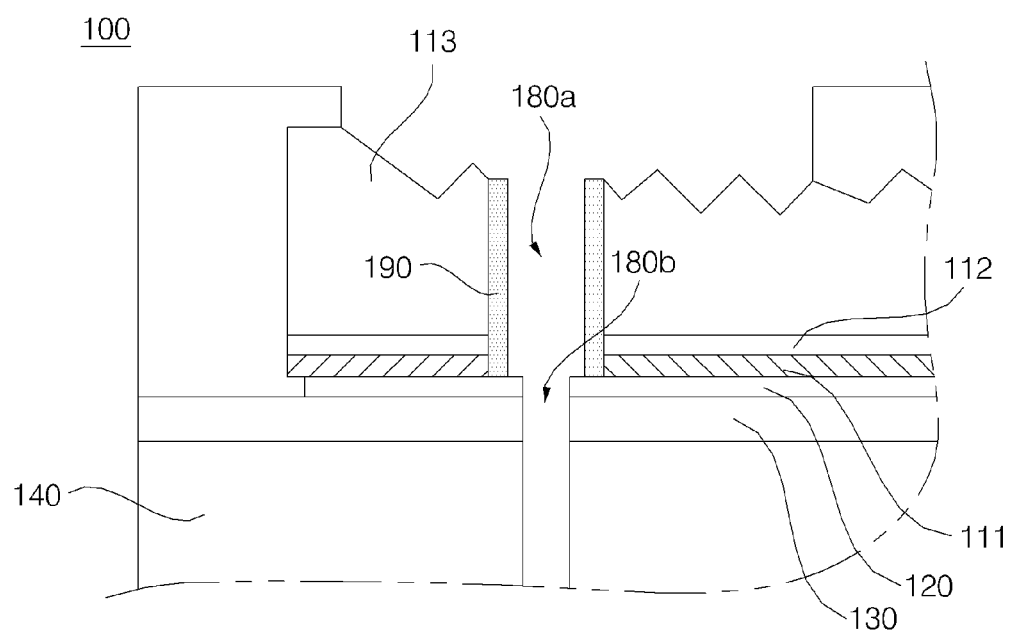

Further, referring to FIG. 6, the passivation layer 190 may have an I shape as described above. Referring to FIG. 6, after laminating a transparent substrate layer 140, a first electrode layer 130, a second conductive semiconductor layer 113, an active layer 112 and a first conductive semiconductor layer 111 in sequence, a through-hole 180a is formed by laser irradiation from the first conductive semiconductor layer 111 to the transparent substrate layer 140 without forming the first passivation layer 190a. Then, a head region 180b is formed on one region of the through-hole 180a and a passivation layer 190 may also be formed at a lateral side of the head region 180b. In this case, one region of the first conductive semiconductor layer 111 may be covered by the top of the passivation layer 190, without being particularly limited thereto.

Compared to the first passivation layer 190a extending in a lateral direction shown in FIGS. 2 to 5B, which additionally requires an operation of forming a first layer 190a between the second conductive semiconductors 113 and another operation of etching one region of each of the second conductive semiconductor layer 113 and the active layer 112, the passivation layer 190 shown in FIG. 6 has an advantage of reducing operation stages.

With regard to the light emitting device described according to FIGS. 1 to 6, the conductive layer 180 may pass through at least one, two or more light emitting structures 110 and be electrically connected to the base conductive layer 150. As the number of conductive layers 180 is increased, power may be uniformly supplied from the base conductive layer 150 to the second conductive semiconductor layer 113. This indicates that a carrier flowing from the second conductive semiconductor layer 113 to the active layer 112 may be homogeneously distributed.

Accordingly, the light emitting device 100 according to one embodiment may include two or more conductive layers 180 and the number thereof may of course be determined in consideration of a size or luminous efficacy of the light emitting device 100.

Figure 7:
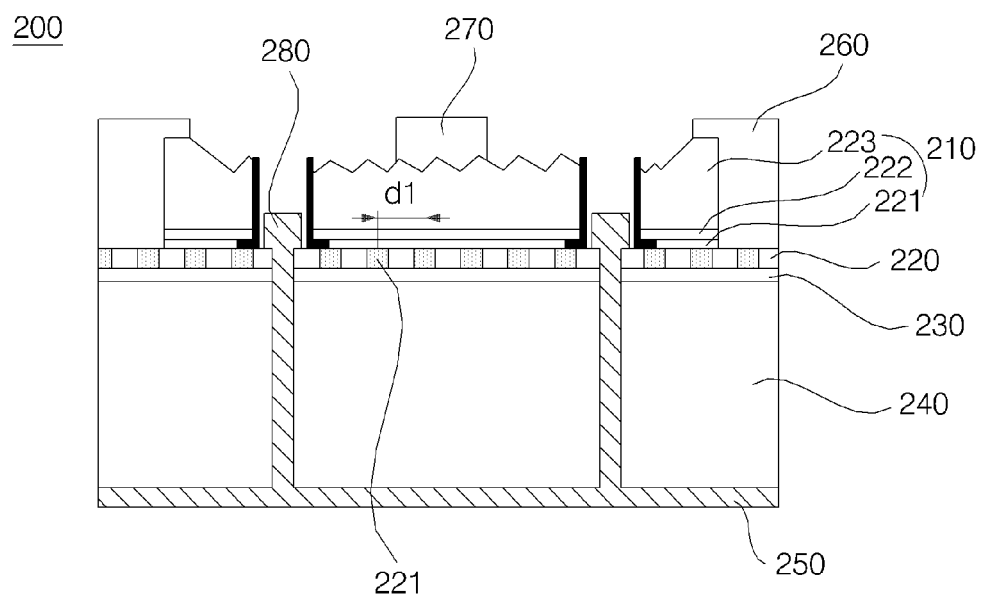
FIG. 7 is a cross-sectional view illustrating a light emitting device according to one embodiment.

FIG. 7 is a cross-sectional view illustrating a light emitting device according to one embodiment.

Referring to FIG. 7, the light emitting device according to one embodiment comprises a first electrode layer 220, a substrate 240, a bonding layer 230, a base conductive layer 250, a light emitting structure 210, a passivation layer 260 and a top contact layer (a second electrode layer) 270, wherein a reflective layer 221 is disposed on the first electrode layer 220 to orient light emitted by the light emitting structure 210 toward the second electrode layer 270.

The bonding layer 230, base conductive layer 250, light emitting structure 210, passivation layer 260 and second electrode layer 270 illustrated in FIG. 7, respectively, have the same structures and/or functions as those of the bonding layer 130, base conductive layer 150, light emitting structure 110, passivation layer 160 and second electrode layer 170 illustrated in FIG. 1. Therefore, a detailed description thereof will be omitted to avoid repetition, instead refer to the description of constituent elements illustrated in FIG. 1.

The light emitting device according to one embodiment may have improved light extraction efficiency by forming a reflective layer 221, which contains a material having reflective properties, for example, Ag, Al or an oxide thereof. The reflective layer 221 may be included in the first electrode layer 220, and be disposed at a constant interval 'd1' or, otherwise, in the form of irregular dots inside the first conductive layer 220, so as to ensure connection of the conductive layer 280 to the base conductive layer 250 and orientation of light emitted by the light emitting structure 210 toward a transparent substrate 240, without interruption thereof.

Since the first electrode layer 220 includes a dot type reflective layer 221, light distribution pattern of the light emitting device 200 may be improved.

Figure 8:
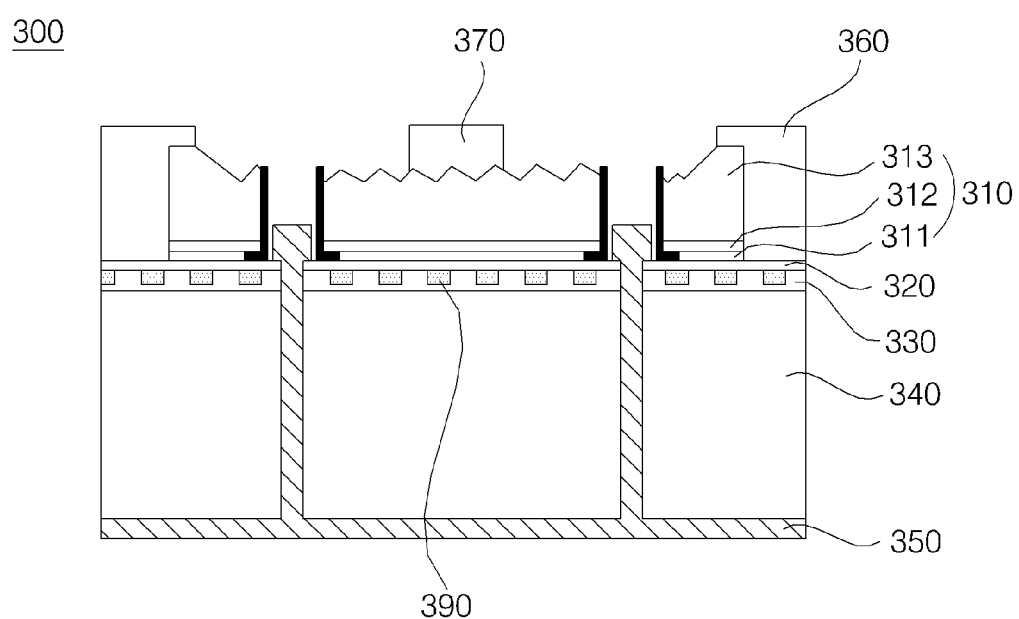
FIG. 8 is a cross-sectional view illustrating a light emitting device according to one embodiment.

FIG. 8 is a conceptual cross-sectional view illustrating a light emitting device according to one embodiment.

Referring to FIG. 8, the light emitting device according to one embodiment comprises a first electrode layer 320, a substrate 340, a bonding layer 330, a base conductive layer 350, a light emitting structure 310, a passivation layer 360 and a second electrode layer 370, wherein a reflective layer 390 is independently disposed between the first electrode layer 320 and the bonding layer 330, in order to orient light emitted by the light emitting structure 310 in upper and lateral directions.

The bonding layer 330, base conductive layer 350, light emitting structure 310, passivation layer 360 and second electrode layer 370 illustrated in FIG. 8, respectively, have the same structures and/or functions as those of the bonding layer 130, base conductive layer 150, light emitting structure 110, passivation layer 160 and second electrode layer 170 described with reference to FIG. 1. Therefore, a detailed description thereof will be omitted to avoid repetition, instead refer to the description of constituent elements illustrated in FIG. 1. In embodiments, the reflective layer 390 is disposed independently of the substrate 340 and/or the bonding layer 330, and may have an unevenness structure formed by etching the bonding layer 330 or be formed by vapor-depositing Ag, Al and/or an oxide thereof in a dot form on the first electrode layer 320.

By providing a dot type reflective layer 390 between the first electrode layer 320 and the bonding layer 330, light distribution of the light emitting device 300 may be improved.

Figure 9A:
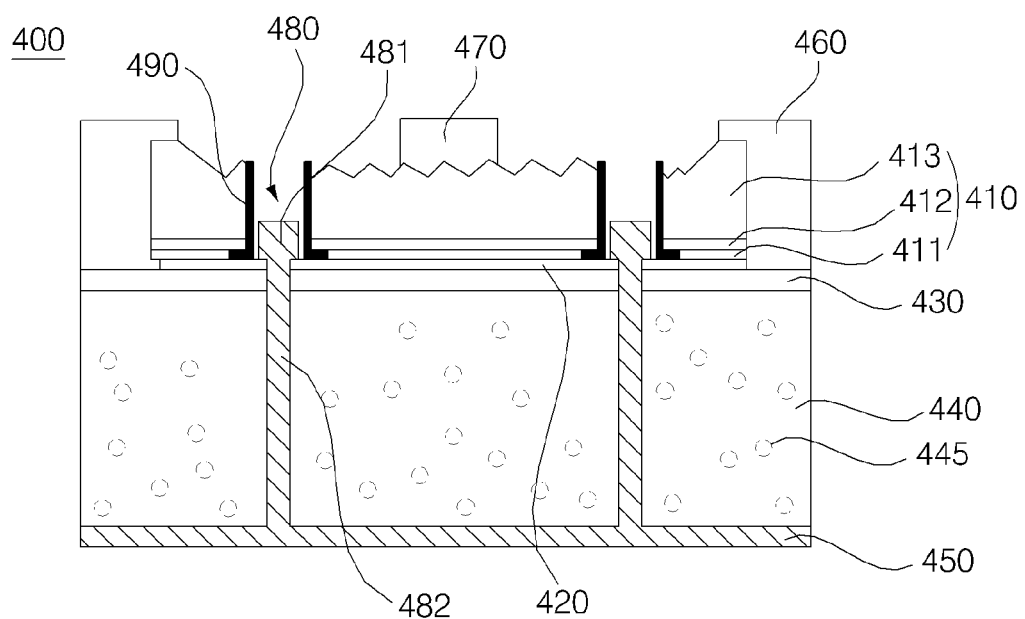
FIG. 9A is a cross-sectional view illustrating a light emitting device according to one embodiment.

FIG. 9A is a cross-sectional view illustrating a light emitting device according to one embodiment.

Referring to FIG. 9A, a light emitting device 400 according to the embodiment may include a substrate containing a wave conversion material 445.

Figure 9B:
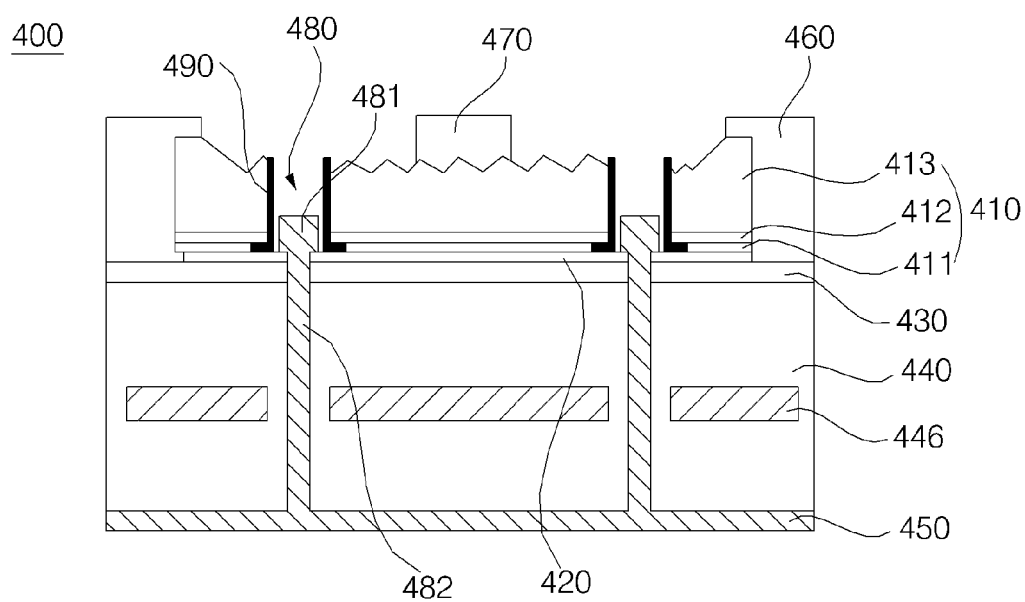
FIG. 9B is a cross-sectional view illustrating a light emitting device according to one embodiment.

The substrate 440 may include the wave conversion material 445 and the wave conversion material 445 may be distributed in the substrate or, as illustrated in FIG. 9B, a desired wave conversion layer 445 may be formed.

For instance, the wave conversion material 445 is mixed and cured while fabricating the substrate 440, in turn being distributed in the substrate 440, or applying the wave conversion material 445 to the substrate 440 then covering the same with a desired material may result in a wave conversion layer 446, without being particularly limited thereto.

Since the wave conversion material 445 is included in the substrate 440, the wave conversion material 445 is excited when light emitted by the light emitting structure 410 passes through the substrate 440. Also, types of the wave conversion material may be suitably selected, considering the wavelength of light emitted by the light emitting device 400, to allow the light-emitting device package 400 to produce white light.

The wave conversion material 445 may be any one selected from a blue light emitting phosphor, blue-green light emitting phosphor, green light emitting phosphor, yellow-green light emitting phosphor, yellow light emitting phosphor, yellow-red light emitting phosphor, orange light emitting phosphor and red light emitting phosphor, depending upon the wavelength of light emitted by the light emitting device 400.

That is, the wave conversion material 445 is excited by first light emitted by the light emitting device 400 to create second light. For instance, in the case where the light emitting device 400 is a blue light emitting diode (LED) and the phosphor (not shown) is a yellow phosphor, the yellow phosphor is excited by blue light to emit yellow light, and blue light emitted from the blue LED and yellow light excited from the blue light are combined, the light emitting device 400 may emit white light.

Similarly, if the light emitting device 400 is a green LED, a magenta phosphor or a combination of blue and red phosphors may be employed. Alternatively, when the light emitting device 4000 is a red LED, a cyan phosphor or a combination of blue and green phosphors may be employed.

Such wave conversion material 445 may be any one commonly known in the art, such as a YAG, TAG, sulfide, silicate, aluminate, nitride, carbide, nitride-silicate, borate, fluoride or a phosphate based material, etc.

Figure 10:
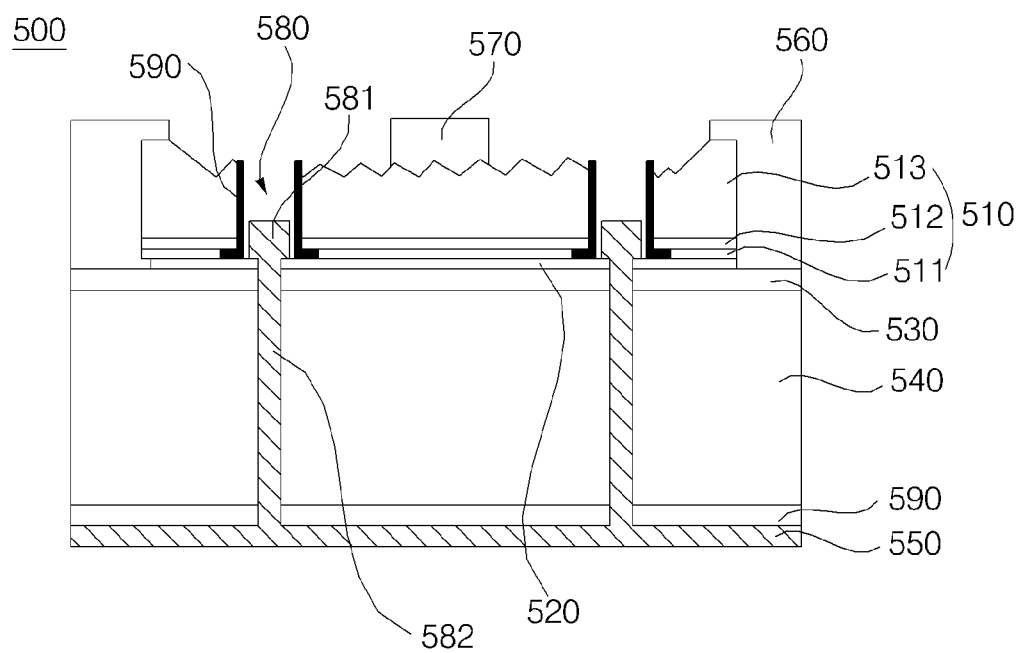
FIG. 10 is a cross-sectional view illustrating a light emitting device according to one embodiment.

FIG. 10 is a cross-sectional view illustrating a light emitting device according to one embodiment.

Referring to FIG. 10, a light emitting device 500 according to the embodiment may include a reflective layer 590 disposed between a substrate 540 and a base conductive layer 550.

The reflective layer 590 is placed between the substrate 540 and the base conductive layer 550 and may comprise, for example, at least one selected from Ag, Rh, Ni, Au, Pd, Ir, Ti, Pt, W and Al.

Since the reflective layer 590 is formed between the substrate 540 and the base conductive layer 550, light emitted by the light emitting structure 510 may pass through the substrate 540 and, then, be reflected by the reflective layer 590 to propagate in upper and lateral directions, thus preventing light absorption by the base conductive layer 550.

Figure 11A:
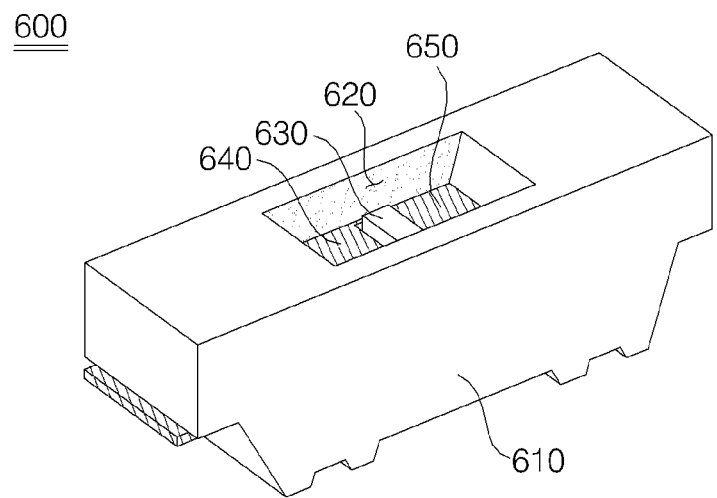
FIG. 11A is a perspective view illustrating a light-emitting device package including a light emitting device according to one embodiment.
Figure 11B:
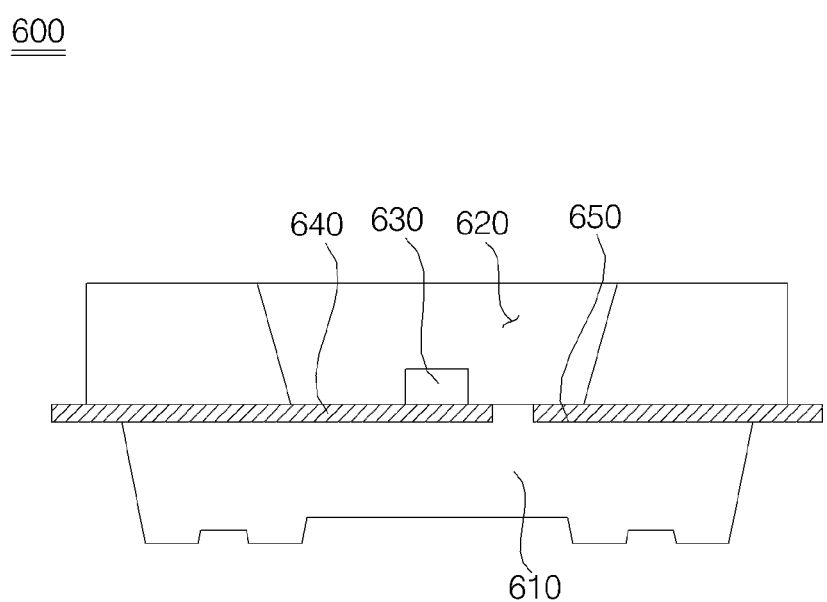
FIG. 11B is a cross-sectional view illustrating a light-emitting device package including a light emitting device according to one embodiment.

FIGS. 11A and 11B are a perspective view and cross-sectional view, respectively, illustrating a light-emitting device package according to one embodiment.

Referring to FIGS. 11A and 11B, the light-emitting device package 600 comprises: a body 610 having a cavity 620 formed therein; first and second lead frames 640 and 550 mounted on the body 610; a light emitting device 630 electrically connected to the first and second lead frames 640 and 550; and a sealant (not shown) filling the cavity 620 to cover the light emitting device 630.

The body 610 may be formed using at least one selected from polyphthalamide (PPA) as a resin material, silicon (Si), aluminum (Al), aluminum nitride (AlN), photosensitive glass (PSG), polyaminde 9T (PA9T), syndiotactic polystyrene (SPS), metal materials, sapphire ($Al_2O_3$), beryllium oxide (BeO), a printed circuit board (PCB), or the like. The body 310 may be formed by injection molding, etching, etc., without being particularly limited thereto.

The inner surface of the body 610 may be disposed with an inclined surface. The reflective angle of light emitted from the light emitting device 320 may be varied, depending on the angle of the inclined surface. Accordingly, the orientation angle of light emitted to the outside can be controlled.

By decreasing the light orientation angle, concentration of light emitted from the light emitting device 630 to the outside may be increased. On the contrary, if the light orientation angle is increased, concentration of light emitted from the light emitting device 630 to the outside may be reduced.

When viewing the cavity 620 in the body 610 from the top side, it may take various shapes including a circular shape, a rectangular shape, a polygonal shape, an elliptical shape, and a shape with curved corners, without being particularly limited thereto.

The light emitting device 630 is mounted on the first lead frame 640 and, for instance, may be a light emitting device to emit red, green, blue or white light or an ultraviolet (UV) light emitting device to emit UV light, without being particularly limited thereto. Moreover, at least one light emitting device 630 may be disposed.

The light emitting device 630 may be generally applied to a horizontal type device having all electric terminals formed on the top face thereof, a vertical type device having all electric terminals formed on the top or bottom face thereof, or a flip-chip device.

Meanwhile, the light emitting device 630 may include an active layer (not shown) and the active layer (not shown) may have a multiple quantum well structure containing multiple well layers wherein a well layer adjacent to a p-type semiconductor layer has a large band gap and a large thickness, thus improving luminous efficacy of the light emitting device 630 and the light-emitting device package 600.

The sealant (not shown) may fill the cavity 620 to cover the light emitting device 630.

The sealant (not shown) may comprise silicon, epoxy or other resin materials and be formed by UV or thermal curing, after filling the cavity 620.

The sealant (not shown) may include a phosphor and types of the phosphor may be selected considering the wavelength of light emitted by the light emitting device 630, enabling the light-emitting device package 600 to produce white light.

The phosphor may be any one selected from a blue light emitting phosphor, blue-green light emitting phosphor, green light emitting phosphor, yellow-green light emitting phosphor, yellow light emitting phosphor, yellow-red light emitting phosphor, orange light emitting phosphor and red light emitting phosphor, depending upon the wavelength of light emitted by the light emitting device 630.

That is, the phosphor is excited by first light emitted from the light emitting device 630 to create second light. For instance, in the case where the light emitting device 630 is a blue light emitting diode (LED) and the phosphor 240 is a yellow phosphor, the yellow phosphor is excited by blue light to emit yellow light, and blue light emitted from the blue LED and yellow light excited from the blue light are combined, the light-emitting device package 600 may emit white light.

Similarly, if the light emitting device 630 is a green LED, a magenta phosphor or a combination of blue and red phosphors may be employed. Alternatively, when the light emitting device 630 is a red LED, a cyan phosphor or a combination of blue and green phosphors may be employed.

Such phosphor may be any one commonly known in the art, such as YAG, TAG, sulfide, silicate, aluminate, nitride, carbide, nitride-silicate, borate, fluoride or a phosphate based material, etc.

The first and second lead frames 640 and 550 may include a metal material selected from, for example, titanium (Ti), copper (Cu), nickel (Ni), gold (Au), chrome (Cr), tantalum (Ta), platinum (Pt), tin (Sn), silver (Ag), phosphorus (P), aluminum (Al), indium (In), palladium (Pd), cobalt (Co), silicon (Si), germanium (Ge), hafnium (Hf), ruthenium (Ru), iron (Fe), and alloys thereof. In addition, the first and second lead frames 640 and 550 may have a single layer or multi-layered structure, without being limited thereto.

The first and second lead frames 640 and 550 may be electrically isolated from each other. The light emitting device 630 may be mounted on the first and second lead frames 640 and 550, and the first and second lead frames 640 and 550 may directly contact the light emitting device 630 or, otherwise, be electrically connected through a conductive material such as a soldering member (not shown). Alternatively, the light emitting device 630 may be electrically connected to the first and second lead frames 640 and 550 through wire-bonding, without being particularly limited thereto. Accordingly, if the first and second lead frames 640 and 550 are connected to a power supply, electric current may be applied to the light emitting device 630. Further, multiple lead frames (not shown) may be built in the body 610 and respective ones may be electrically connected to the light emitting device 630, without being particularly limited thereto.

Figure 12A:
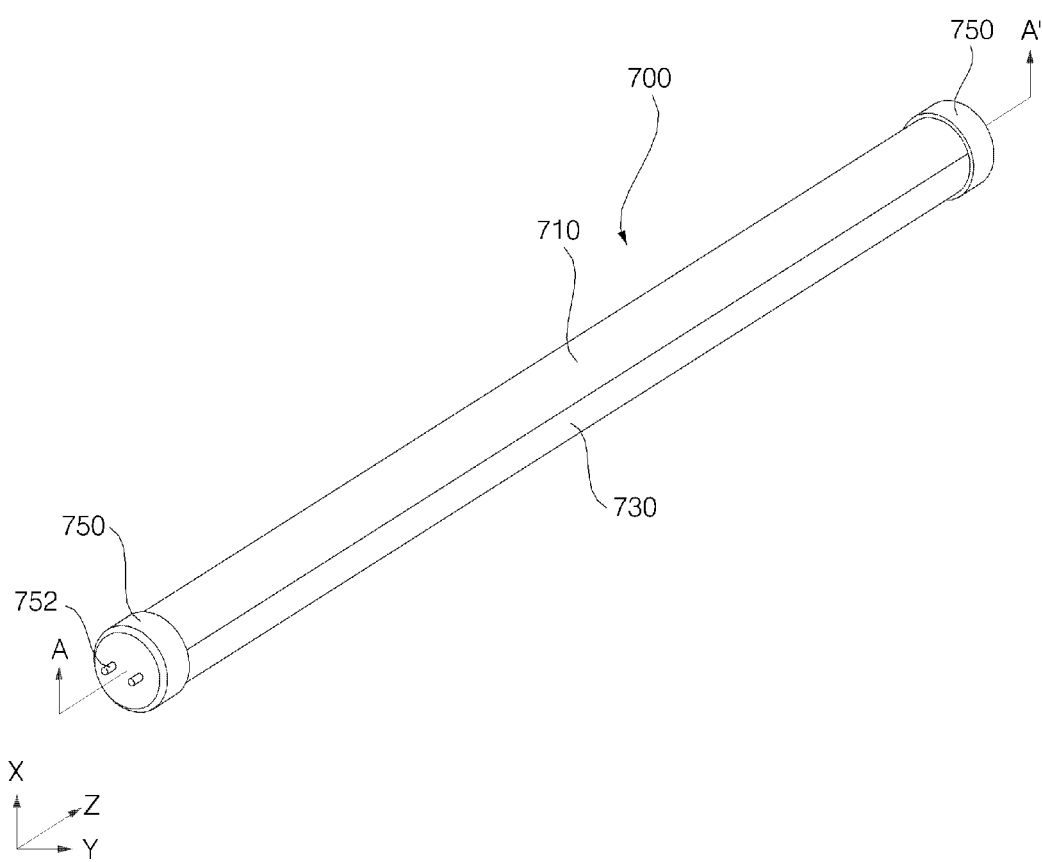
FIG. 12A is a perspective view illustrating a lighting apparatus including the light-emitting device package according to another embodiment.
Figure 12B:
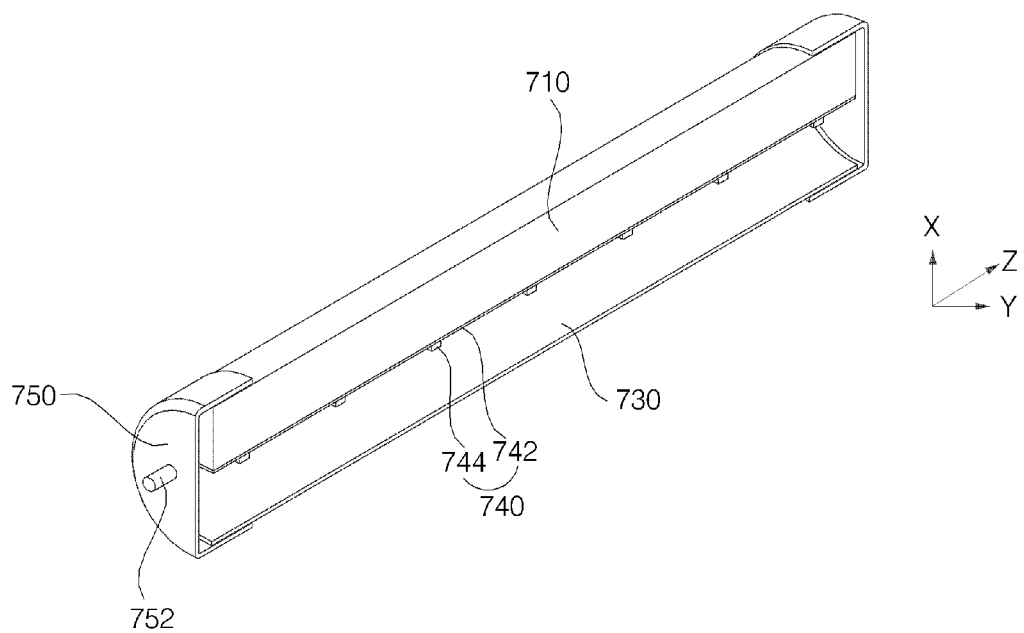
FIG. 12B is a sectional view illustrating a lighting apparatus including the light-emitting device package according to the embodiment.

FIG. 12A is a perspective view illustrating a lighting apparatus having the light-emitting device package according to one embodiment, while FIG. 12B is a cross-sectional view taken along line A-A' of the lighting apparatus shown in FIG. 12A.

Hereinafter, in order to concretely explain the morphology of a lighting apparatus 700 according to one embodiment, a detailed description will be given of a length direction Z, a horizontal direction Y perpendicular to the length direction Z, and a height direction perpendicular to both the length direction Z and the horizontal direction Y.

That is, FIG. 12B is a cross-sectional view taken along both cross-sections in a length direction Z and a height direction X and when the lighting apparatus 700 shown in FIG. 12A is viewed in a horizontal direction Y.

Referring to FIGS. 12A and 12B, the lighting apparatus 700 may include a body 710, a cover 730 coupled to the body 710, and end caps 750 at both ends of the body 710.

A light-emitting device module 740 may be coupled to the bottom side of the body 710 and, in order to discharge heat generated by a light-emitting device package 744 to the outside through the top of the body 710, the body 710 may be made of metal materials having excellent thermal conductivity and heat dissipation effects, without being particularly limited thereto.

The light-emitting device package 744 may be mounted on a substrate 742 with multiple colors and in multiple rows to form an array, and may be spaced from one another by a predetermined interval or, if necessary, by different distances, to control brightness. Such a substrate 742 may be a metal core PCB (MPPCB) or a PCB made of FR4.

The cover 730 may take the shape of a circle to surround the bottom of the body 710, without being particularly limited thereto.

The cover 730 protects the light-emitting device module 740 from foreign substances. In addition, the cover 730 prevents glare due to the light-emitting device package 744 and includes diffusion particles to uniformly discharge light to the outside. In addition, a prism pattern or the like may be formed on at least one of the inner and outer faces of the cover 730. Alternatively, a phosphor may be applied to at least one of the inner and outer faces of the cover 730.

Meanwhile, since the cover 730 should exhibit superior light transmittance to discharge light emitted by the light-emitting device package 744 through the cover 730 to the outside, the cover 730 should exhibit sufficient heat resistance to endure heat generated by the light-emitting device package 744. the cover 730 may be composed of a material including polyethylene terephthalate (PET), polycarbonate (PC) or polymethyl methacrylate (PMMA) and the like.

The end cap 750 is disposed on both ends of the body 710 and may be used to seal a power supply (not shown). In addition, the end cap 750 is disposed with a power pin 752, allowing the lighting apparatus 700 to be applied to a terminal from which a conventional fluorescent light has been removed, without using any additional device.

Figure 13:
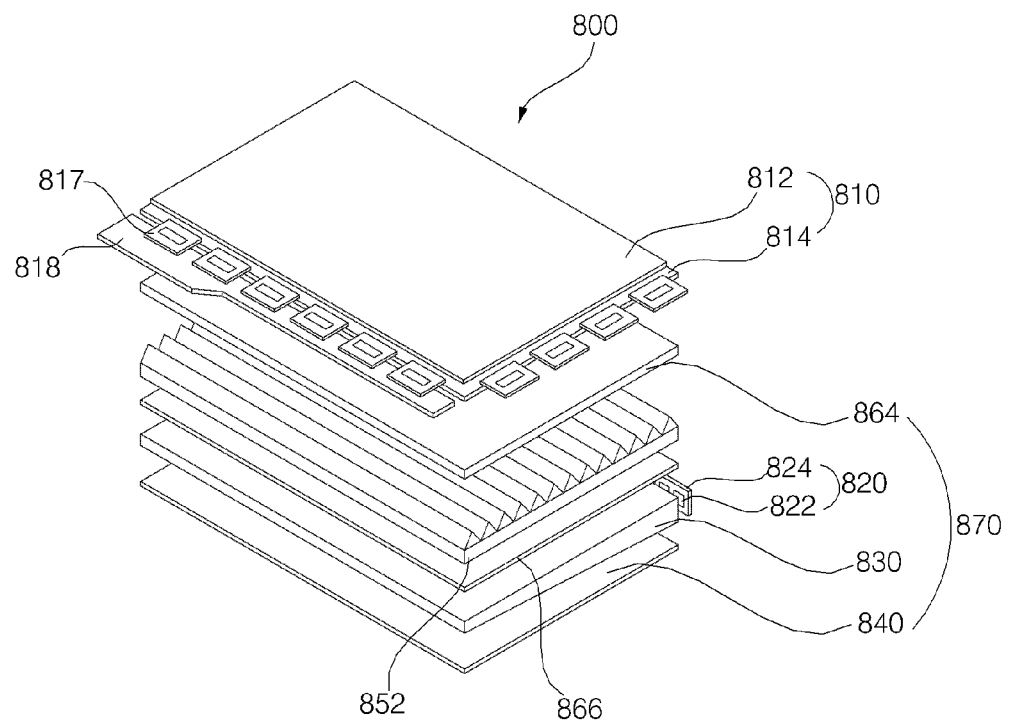
FIG. 13 is an exploded perspective view illustrating a backlight unit including a light emitting device according to one embodiment.

FIG. 13 is an exploded perspective view illustrating a liquid crystal display device employing a light emitting device according to one embodiment.

FIG. 13 illustrates an edge-light type liquid crystal display device 800 which includes a liquid crystal display panel 810 and a backlight unit 870 to supply light to the liquid crystal display panel 810.

The liquid crystal display panel 810 displays an image using light supplied from the backlight unit 870. The liquid crystal display panel 810 includes a color filter substrate 812 and a thin film transistor substrate 814 which face each other through liquid crystal interposed therebetween.

The color filter substrate 812 can render color images to be displayed through the liquid crystal display panel 810.

The thin film transistor substrate 814 is electrically connected to a printed circuit board 818 on which a plurality of circuit components is mounted through a driving film 817. The thin film transistor substrate 814 responds to drive signals supplied from the printed circuit board 818 and may apply drive voltage from the printed circuit board 818 to liquid crystals.

The thin film transistor substrate 814 includes a thin film transistor and a pixel electrode formed as a thin film on other substrates composed of a transparent material such as glass or plastic.

The backlight unit 870 includes; a light-emitting device module 820 to emit light, a light guide plate 830 to convert light emitted by the light-emitting device module 820 into surface light and supply the light to the liquid crystal display panel 810, a plurality of films 850, 866 and 864 to uniformize brightness distribution of light emitted by the light guide plate 830 and improve vertical incidence, and a reflective sheet 840 to reflect light emitted to the back of the light guide plate 830 to the light guide plate 830.

The light-emitting device module 820 includes a plurality of light-emitting device packages 824 and a PCB 822 on which the light-emitting device packages 824 are mounted to form an array.

Meanwhile, a backlight unit 870 includes a diffusion film 866 to diffuse light projected from the light guide plate 830 toward the liquid crystal display panel 810, a prism film 850 to concentrate the diffused light and thus improve vertical incidence, and a protective film 864 to protect the prism film 850.

Figure 14:
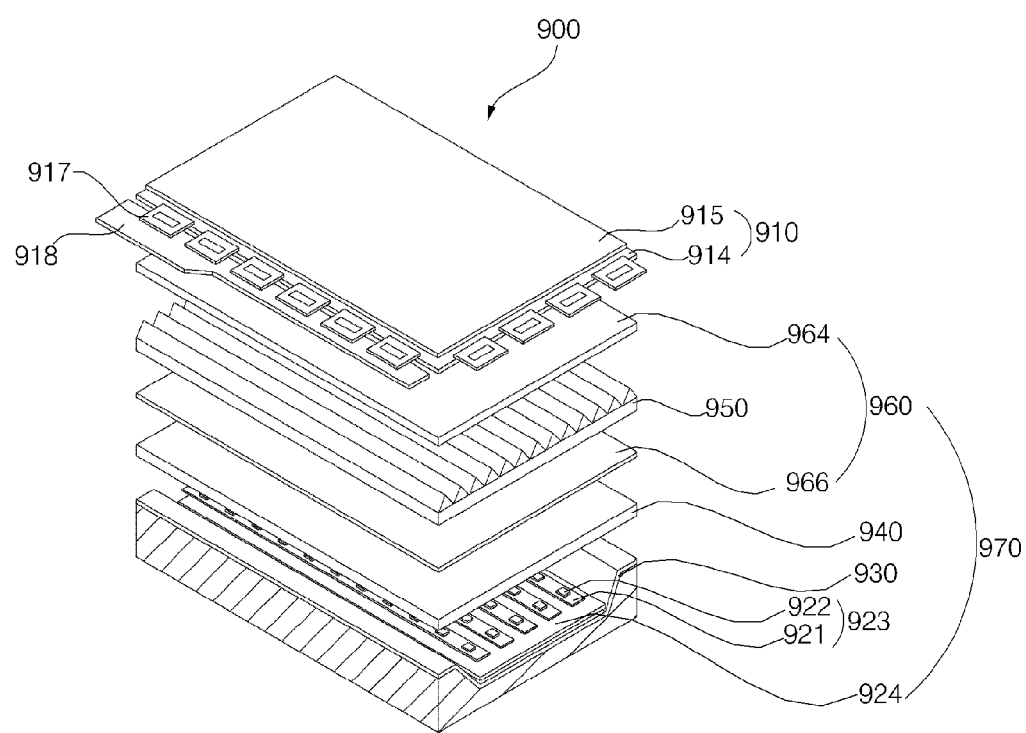
FIG. 14 is an exploded perspective view illustrating a backlight unit including a light emitting device according to one embodiment.

FIG. 14 is an exploded perspective view illustrating a liquid crystal display including the light emitting device according to one embodiment. However, the contents illustrated and described in FIG. 13 are not mentioned in detail.

FIG. 14 illustrates a direct-type liquid crystal display device 900 which includes a liquid crystal display panel 910 and a backlight unit 970 to supply light to the liquid crystal display panel 910.

The liquid crystal display panel 910 is substantially the same as described in FIG. 13 and a detailed explanation thereof is omitted.

The backlight unit 970 includes a plurality of light-emitting device modules 923, a reflective sheet 924, a lower chassis 930 in which the light-emitting device modules 923 and the reflective sheet 924 are accepted, a diffusion plate 940 positioned above the light-emitting device modules 923, and a plurality of optical films 960.

Each light-emitting device module 923 includes a plurality of light-emitting device packages 922 and a PCB 921 on which the light-emitting device packages 922 are mounted to form an array.

Specifically, since the light-emitting device package 922 is composed of a conductive material and has a film including a plurality of holes formed thereon, which is disposed on a light emitting face of the package, an additional lens is not required, thus realizing a slim light-emitting device package and, at the same time, enhancing light extraction efficiency. Moreover, a backlight unit 970 having reduced thickness may be realized.

The reflective sheet 924 reflects light emitted from the light-emitting device package 922 toward the liquid crystal display panel 910, so as to improve luminous efficacy.

Meanwhile, light emitted from the light-emitting device module 923 is projected onto the diffusion plate 940 and an optical film 960 is disposed on top of the diffusion plate 940. The optical film 960 includes a diffusion film 966, a prism film 950 and a protective film 964.

As is apparent from the forgoing, the light emitting device according embodiments of the present disclosure includes a light emitting structure reliably combined with the substrate and ensuring electrical connection thereof to the light emitting device.

Although the embodiments of the present disclosure have been disclosed for illustrative purposes, those skilled in the art will appreciate that various modifications, additions and substitutions are possible, without departing from the scope and spirit of the disclosure as disclosed in the accompanying claims. For example, the respective elements described in detail in the embodiments may be modified. Further, it will be understood that differences relating to these modifications, additions and substitutions are within the scope of the disclosure defined in the accompanying claims.

What is claimed is:

1. A light emitting device, comprising:
   a substrate;
   a first electrode layer disposed on the substrate;
   a light emitting structure disposed on the first electrode layer, which includes a first conductive semiconductor layer, a second conductive semiconductor layer and an active layer placed between the first and second conductive semiconductor layers; and
   a conductive layer, which includes a base conductive layer disposed under the substrate, a body connected to the base conductive layer while passing through the substrate and the first electrode layer, and a head disposed on top of the first electrode layer.

2. The light emitting device according to claim 1, wherein at least one region of the head has a larger width than that of the body.

3. The light emitting device according to claim 1, wherein the bottom of the head contacts the first electrode layer.

4. The light emitting device according to claim 1, wherein the width of the head ranges from 50 μm to 100 μm.

5. The light emitting device according to claim 1, wherein a height of the head ranges from 1 μm to 6 μm.

6. The light emitting device according to claim 1, wherein the width of the body ranges from 10 μm to 30 μm.

7. The light emitting device according to claim 1, further comprising: a passivation layer between the light emitting structure and the conductive layer.

8. The light emitting device according to claim 7, wherein at least one region of the passivation layer includes a projection extending in a lateral direction.

9. The light emitting device according to claim 1, wherein the conductive layer contains at least one of Au, Ni, Pt, Al, Cr and Ag.

10. The light emitting device according to claim 1, wherein the first electrode layer exhibits light transmittance.

11. The light emitting device according to claim 1, wherein the first electrode layer includes at least one of IZO, IZTO, IAZO, IGZO, IGTO, AZO and ATO.

12. The light emitting device according to claim 1, wherein the substrate exhibits light transmittance.

13. The light emitting device according to claim 1, wherein the substrate has a thickness of 50 μm to 500 μm.

14. The light emitting device according to claim 1, wherein the substrate further includes a light extraction structure disposed on at least one region thereof.

15. The light emitting device according to claim 1, wherein the substrate has a lower index of refraction than that of the second conductive semiconductor layer.

16. The light emitting device according to claim 1, wherein the substrate has an index of refraction ranging from 1.4 to 2.4.

17. The light emitting device according to claim 1, wherein the substrate includes a wave conversion material.

18. The light emitting device according to claim 1, further comprising a reflective layer disposed between the substrate and the base conductive layer.

19. The light emitting device according to claim 18, wherein the reflective layer contains at least one of Ag, Rh, Ni, Au, Pd, Ir, Ti, Pt, W and Al.

20. A lighting system, including:
    a body;
    a cover coupled to the body;
    end caps at both ends of the body; and
    A light-emitting device module coupled to the bottom side of the body,
    Wherein light-emitting device module including a light emitting device, and
    the light emitting device includes:
    a substrate;
    a first electrode layer disposed on the substrate;
    a light emitting structure disposed on the first electrode layer, which includes a first conductive semiconductor layer, a second conductive semiconductor layer and an active layer placed between the first and second conductive semiconductor layers; and
    a conductive layer, which includes a base conductive layer disposed under the substrate, a body connected to the base conductive layer while passing through the substrate and the first electrode layer, and a head disposed on top of the first electrode layer.

* * * * *